US010749110B1

(12) United States Patent
Narayanan et al.

(10) Patent No.: US 10,749,110 B1
(45) Date of Patent: Aug. 18, 2020

(54) MEMORY STACK LINER COMPRISING DIELECTRIC BLOCK LAYER MATERIAL

(71) Applicant: Crossbar, Inc., Santa Clara, CA (US)

(72) Inventors: Sundar Narayanan, Cupertino, CA (US); Zhen Gu, Cupertino, CA (US); Natividad Vasquez, San Francisco, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 15/486,529

(22) Filed: Apr. 13, 2017

Related U.S. Application Data

(60) Provisional application No. 62/362,705, filed on Jul. 15, 2016.

(51) Int. Cl.
*H01L 45/00* (2006.01)

(52) U.S. Cl.
CPC .......... *H01L 45/1683* (2013.01); *H01L 45/08* (2013.01); *H01L 45/124* (2013.01); *H01L 45/1253* (2013.01); *H01L 45/145* (2013.01); *H01L 45/1608* (2013.01)

(58) Field of Classification Search
USPC ....................................................... 438/382
See application file for complete search history.

(56) References Cited

U.S. PATENT DOCUMENTS

| | | | |
|---|---|---|---|
| 7,102,150 B2 | 9/2006 | Harshfield et al. | |
| 7,129,167 B1 | 10/2006 | Bailey, III et al. | |
| 7,355,324 B2 | 4/2008 | Kim et al. | |
| 7,510,929 B2 | 3/2009 | Chen | |
| 7,642,695 B2 | 1/2010 | Fujii | |
| 8,287,943 B2 | 10/2012 | Lucat et al. | |
| 8,519,485 B2 | 8/2013 | Herner | |
| 8,750,019 B2 | 6/2014 | Lu | |
| 8,815,696 B1 | 8/2014 | Herner | |
| 8,884,261 B2 | 11/2014 | Jo et al. | |
| 8,946,046 B1 | 2/2015 | Jo | |
| 8,993,397 B2 | 3/2015 | Herner | |
| 9,036,400 B2 | 5/2015 | Lu | |
| 9,425,046 B1 | 8/2016 | Gee et al. | |
| 9,437,814 B1 | 9/2016 | Gee et al. | |
| 9,583,701 B1 | 2/2017 | Gee et al. | |
| 9,595,670 B1 | 3/2017 | Gee et al. | |
| 9,627,443 B2 | 4/2017 | Jo et al. | |
| 9,735,358 B2 | 8/2017 | Jo et al. | |
| 9,741,765 B1 | 8/2017 | Narayanan et al. | |
| 2005/0093156 A1 | 5/2005 | Naruse et al. | |

(Continued)

OTHER PUBLICATIONS

Lu et al., "Two-Terminal Resistive Switches (Memristors) for Memory and Logic Applications," 2011, IEEE, pp. 217-223, 7 pages.

(Continued)

*Primary Examiner* — Timor Karimy
(74) *Attorney, Agent, or Firm* — Wegman Hessler

(57) ABSTRACT

Two-terminal memory devices can be formed in dielectric material that is electrically insulating and operates as a blocking layer to mitigate diffusion of material from a metal layer. A stack of layers of the two-terminal memory device can be covered with a liner layer that can comprise the dielectric material. Thus, in some implementations, the liner layer and the blocking layer can have a similar etch rate.

20 Claims, 14 Drawing Sheets

(56) References Cited

U.S. PATENT DOCUMENTS

| | | |
|---|---|---|
| 2006/0186759 A1 | 8/2006 | Kim et al. |
| 2007/0232015 A1 | 10/2007 | Liu |
| 2008/0001137 A1 | 1/2008 | Kozicki et al. |
| 2008/0116437 A1 | 5/2008 | Oh et al. |
| 2009/0098678 A1 | 4/2009 | Lung |
| 2009/0152737 A1 | 6/2009 | Harshfield |
| 2010/0048007 A1 | 2/2010 | Lee et al. |
| 2010/0072515 A1 | 3/2010 | Park et al. |
| 2010/0109106 A1 | 5/2010 | Zhong et al. |
| 2010/0124818 A1 | 5/2010 | Lee et al. |
| 2010/0155687 A1 | 6/2010 | Reyes et al. |
| 2011/0001108 A1 | 1/2011 | Greene et al. |
| 2011/0059557 A1 | 3/2011 | Yamagishi et al. |
| 2011/0168966 A1 | 7/2011 | Lam et al. |
| 2011/0312151 A1 | 12/2011 | Herner |
| 2012/0015506 A1 | 1/2012 | Jo et al. |
| 2012/0193785 A1 | 8/2012 | Lin et al. |
| 2012/0235112 A1 | 9/2012 | Huo et al. |
| 2013/0037777 A1 | 2/2013 | Mikawa et al. |
| 2013/0062586 A1 | 3/2013 | Ren |
| 2013/0082231 A1 | 4/2013 | Tada et al. |
| 2013/0134379 A1 | 5/2013 | Lu |
| 2013/0140513 A1 | 6/2013 | Lai et al. |
| 2013/0187109 A1 | 7/2013 | Tan et al. |
| 2014/0084233 A1 | 3/2014 | Maxwell |
| 2014/0145135 A1 | 5/2014 | Gee et al. |
| 2014/0213032 A1 | 7/2014 | Kai et al. |
| 2014/0284544 A1 | 9/2014 | Miyagawa |
| 2014/0370696 A1 | 12/2014 | Tu et al. |
| 2015/0060750 A1 | 3/2015 | Sung et al. |
| 2015/0147864 A1* | 5/2015 | Liao ........................ H01L 45/04 438/382 |
| 2015/0194601 A1* | 7/2015 | Sills ........................ H01L 45/06 257/4 |
| 2015/0228893 A1 | 8/2015 | Narayanan et al. |
| 2015/0340247 A1 | 11/2015 | Balakrishnan et al. |
| 2015/0340609 A1 | 11/2015 | Banno et al. |
| 2016/0020104 A1 | 1/2016 | Lin et al. |
| 2016/0190208 A1 | 6/2016 | Nazarian et al. |
| 2016/0225824 A1 | 8/2016 | Jo et al. |
| 2016/0248008 A1* | 8/2016 | Chen ........................ H01L 45/16 |
| 2016/0351496 A1 | 12/2016 | Liu |
| 2017/0092693 A1 | 3/2017 | Tan et al. |
| 2017/0117467 A1 | 4/2017 | Chang et al. |

OTHER PUBLICATIONS

Office Action dated Nov. 2, 2017 for U.S. Appl. No. 15/592,982, 26 pages.

Office Action dated Oct. 6, 2017 for U.S. Appl. No. 15/480,074, 24 pages.

Taiwanese Office Action and Search Report for Taiwanese Patent Application No. 106119445 dated May 31, 2018, 21 pages (including English Translation).

Notice of Allowance received for U.S. Appl. No. 15/592,982, dated Mar. 30, 2018, 24 pages.

Final Office Action received for U.S. Appl. No. 15/480,074, dated May 31, 2018, 35 pages.

Non-final Office Action for corresponding U.S. Appl. No. 15/480,074 dated Feb. 7, 2019 (41 pages long).

Notice of Allowance for corresponding U.S. Appl. No. 15/480,074 dated Aug. 7, 2019, (9 pages long).

* cited by examiner

MEMORY STACK LINER COMPRISING DIELECTRIC BLOCK LAYER MATERIAL

CROSS-REFERENCE TO RELATED APPLICATIONS

This application claims the benefit of U.S. Provisional Patent Application Ser. No. 62/362,705 filed on Jul. 15, 2016 entitled, "MEMORY STACK LINER COMPRISING DIELECTRIC BLOCK LAYER MATERIAL." The entirety of this application is incorporated herein by reference, for all purposes.

TECHNICAL FIELD

This disclosure generally relates to a liner of a memory stack that comprises the same or substantially similar materials used for a dielectric block layer.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for fabricating a two-terminal memory device. Fabrication can comprise the following: forming a blocking layer overlying a metal layer formed overlying a substrate. The blocking layer can comprises a dielectric material that mitigates diffusion of material of the metal layer. Forming a first via in the dielectric material that exposes the metal layer. Forming a bottom electrode (BE) of the two-terminal memory device in the first via and in contact with the metal layer. Forming a stack of layers comprising a switching layer overlying the BE, a top electrode (TE) overlying the switching layer, and a cap layer overlying the TE Forming a liner layer overlying the dielectric material and the stack of layers, wherein the liner layer comprises the dielectric material.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
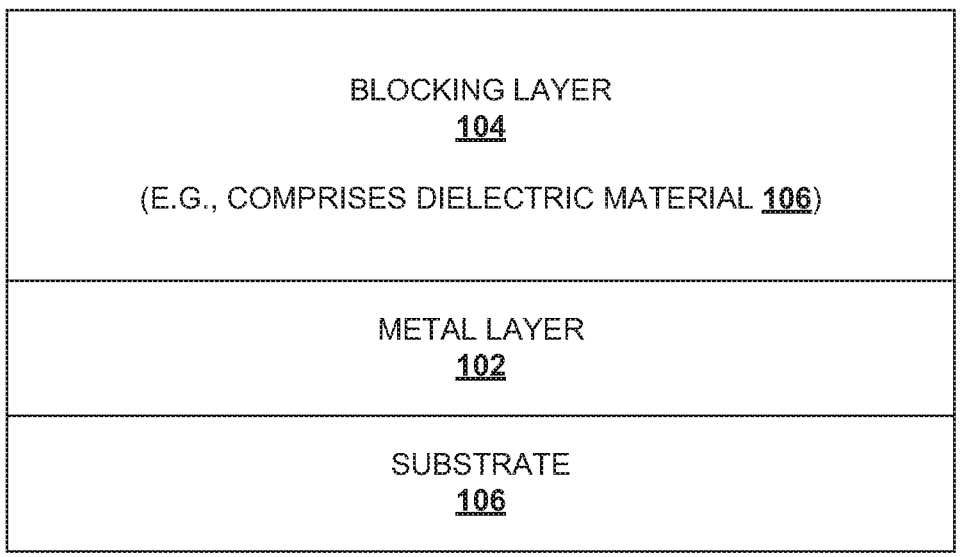
FIG. 1 illustrates a block diagram of an integrated circuit device that provides for forming a blocking layer that mitigates diffusion of material of a metal layer in accordance with certain embodiments of this disclosure.

This disclosure relates to memory devices employed for digital or multi-level information storage, and processes involved in fabricating memory devices. In some embodiments, a two-terminal memory cell can be constructed at least in part according to a process disclosed herein. As an example, the two-terminal memory cell can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts (e.g., electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Embodiments of the subject disclosure can provide a filamentary-based memory cell. In some embodiments, the filamentary-based memory cell includes a non-volatile memory device, whereas other embodiments provide a volatile selector device in electrical series with the non-volatile memory device. In further embodiments, both the volatile selector device and the non-volatile memory device can be filamentary-based devices, though the subject disclosure is not limited to these embodiments.

One example of a filamentary-based device can comprise: one or more conductive layers (e.g., comprising, e.g., TiN, TaN, TiW, metal compounds), an optional interface layer (e.g., doped p-type (or n-type) silicon (Si) bearing layer (e.g., p-type or n-type polysilicon, p-type or n-type polycrystalline SiGe, etc., or a combination of the foregoing)), a resistive switching layer (RSL) and an active metal layer capable of being ionized. Under suitable conditions, the active metal layer can provide filament forming ions to the RSL. In such embodiments, a conductive filament (e.g., formed by the ions) can facilitate electrical conductivity through at least a subset of the RSL, and a resistance of the filament-based device can be determined by a tunneling resistance (or, e.g., ohmic contact resistance) between the filament and the conductive layer. To reverse electrical conductivity resulting from the conductive filament, whether for the volatile selector device or the non-volatile memory device (with the exception of one-time programmable memory devices), the filament can be deformed. In some embodiments, deformation of the filament can comprise the particles (e.g., metal ions)—trapped within the defect locations—becoming neutral particles (e.g., metal atoms) in absence of the bias condition that have a high electrical resistance. In other embodiments, deformation of the filament can comprise dispersion (or partial dispersion) of the particles within the RSL, breaking a conductive electrical path provided by the filament in response to the bias condition. In still other embodiments, deformation of the filament can be in response to another suitable physical mechanism, or a suitable combination of the foregoing.

Generally, deformation of a conductive filament results from a change in the bias conditions to a second set of bias conditions. The second set of bias conditions can vary for different devices. For instance, deformation of a conductive filament formed within the volatile selector device can be implemented by reducing an applied bias below a formation magnitude (or small range of magnitudes, such as a few tens of a volt) associated with filament formation within the volatile selector device. Depending on the embodiment, a conductive filament can be created within a volatile selector device in response to a positive bias (e.g., forward bias) or in response to a negative bias (e.g., reverse bias), and deformation of the filament can occur in response to a suitable lower-magnitude positive bias or a suitable lower-magnitude negative bias, respectively. See U.S. patent application Ser. No. 14/588,185 filed Dec. 31, 2014 commonly owned by the assignee of the present application, and incorporated by reference herein in its entirety and for all purposes. In contrast, deformation of a conductive filament formed within the non-volatile memory device can be implemented by providing a suitable erase bias (e.g., a reverse bias), having opposite polarity from a program bias (e.g., forward bias) utilized to form the conductive filament within the non-volatile memory device.

It should be appreciated that disclosed filamentary-based devices are not limited to the conductive layer(s), RSL and active layer provided above. Additional layers can be included between one or more of the foregoing layers in some embodiments, and where suitable. Examples of such additional layers can include adhesion layers for securing one material to another, blocking layers for mitigating contamination between layers, diffusion barrier layers for mitigating diffusion of an element(s) or compound(s) through the diffusion barrier layer(s), ion layers for providing conducting particles or facilitating electrical conductivity at the ion layer(s); resistive layers for mitigating electrical conductivity at the resistive layer(s) or tunneling layers for controlled electron tunneling through the tunneling layer(s), contact material layers for providing good ohmic contact between two (or more) materials/layers, or other suitable layers known to one of ordinary skill in the art of fabrication of a solid-state memory device, or a suitable combination of the foregoing. In a further embodiment, multiple instances of a layer can be provided (e.g., multiple conductive layers, multiple RSLs, multiple active layers, or multiple other layers).

In various embodiments of a memory cell of the present disclosure, a conductive layer may include a metal, a doped semiconductor, titanium, titanium nitride (TiN), tantalum nitride (TaN), tungsten (W) or other suitable electrical conductor. The RSL (which can also be referred to in the art as a resistive switching media (RSM)) can comprise, e.g., an undoped amorphous Si layer, a semiconductor layer having intrinsic characteristics, a silicon nitride (e.g. SiN, Si3N4, SiNx where x is a suitable positive number, etc.), a Si sub-oxide (e.g., SiOy wherein y has a value between 0.1 and 2), a Si sub-nitride (e.g., SiNy wherein y has a value between 0.1 and 2), an Al sub-oxide, an Al sub-nitride, and so forth. Other examples of materials suitable for the RSL could include $Si_XGe_YO_Z$ (where X, Y and Z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) or other suitable oxides, a metal nitride (e.g., AlN, $AlN_F$ where F is a suitable positive number), a non-stoichiometric silicon compound, and so forth, or a suitable combination thereof. In various embodiments, the RSL includes a number of material voids or defects to trap or hold particles in place, in the absence of an external program stimulus causing the particles to drift within the RSL and form the conductive filament. For the non-volatile memory device then, the particles can remain trapped in the absence of the external program stimulus, requiring a suitable reverse bias (e.g., a negative polarity erase stimulus) to drive the particles out of the voids/defects, or otherwise break continuity of the conductive filament, thereby deforming the conductive filament.

The contact material layer can be comprised of any suitable conductor, such as a conductive metal, a suitably doped semiconductor, or the like. Where utilized, the contact material layer can be employed to provide good ohmic contact between the RSL and a metal wiring layer of an associated memory architecture. In some embodiments, the contact material layer can be removed and the RSL can be in physical contact with a metal wiring layer. Suitable metal wiring layers can include copper, aluminum, tungsten, platinum, gold, silver, or other suitable metals, suitable metal alloys, or combinations of the foregoing. In further embodiments, a diffusion mitigation layer or adhesion layer can be provided between the RSL and the metal wiring layer (or between the RSL and the contact material layer).

Examples of the active metal layer can include, among others: silver (Ag), gold (Au), titanium (Ti), titanium nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. In some embodiments, a thin layer of barrier material composed of Ti, TiN, or the like, may be disposed between the RSL and the active metal layer (e.g., Ag, Al, and so on). Details pertaining to additional embodiments of the subject disclosure similar to the foregoing example(s) can be found in the following U.S. patent applications that are licensed to the assignee of the present application for patent: application Ser. No. 11/875,541 filed Oct. 19, 2007, application Ser. No. 12/575,921 filed Oct. 8, 2009, and the others cited herein, each of which are incorporated by reference herein in their respective entireties and for all purposes.

In response to a suitable program stimulus (or set of stimuli) a conductive path or a filament of varying width and length can be formed within a relatively high resistive portion of a non-volatile memory device (e.g., the RSL). This can cause a memory cell associated with the non-volatile memory device to switch from a relatively high resistive state, to one or more relatively low resistive states. In some resistive-switching devices, an erase process can be implemented to deform the conductive filament, at least in part, causing the memory cell to return to the high resistive state from the low resistive state(s), as mentioned previously. This change of state, in the context of memory, can be associated with respective states of a binary bit or multiple binary bits. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in respective memory cells.

According to various disclosed embodiments, disclosed resistive switching devices can be fabricated consistent with foundry compatible processes. As utilized herein, foundry compatible refers to consistency with physical constraints associated with fabrication of a semiconductor-based device in a commercial semiconductor fabrication foundry, such as Taiwan Semiconductor Manufacturing Corporation, among others. Physical constraints include a thermal budget (e.g., maximum operating temperature) of a die, and of materials and metals constructed on the die prior to a given process step. For example, where a die comprises one or more metal layers or constructs, and viability of device models require the metal layers to maintain tight position tolerance, the thermal budget may be set by the softening temperature of the metal(s) to avoid loss of metal rigidity. Other physical constraints can include, CMOS, nMOS or pMOS fabrication constraints, where suitable, fabrication toolset limitations of a particular metallization scheme (e.g., etching/masking/grooving toolsets available for Aluminum, Copper, etc.), physical properties requiring special process handling (e.g., dispersion properties of Cu, oxidation properties of metals, semi-conducting materials, etc.), or the like, or other constraints of commercial foundry. Accordingly, the phrase "foundry compatible" implies consistency with process limitations of at least one commercial semiconductor fabrication foundry.

Thermal budget refers to an amount of thermal energy transferred to a wafer during a particular temperature operation. During the process of manufacturing the resistive memory, for example, there is a desire to not adversely affect complementary metal oxide semiconductor (CMOS) devices by application of excess heat, or the like. Accordingly, CMOS devices within a substrate can impose a thermal budget constraint to the manufacture of memory components upon a CMOS chip or substrate (e.g., by way of a backend of line fabrication process). Likewise, thermal budget constraints should be considered during the manufacture of a resistive memory device in an integrated circuit, for instance.

An integrated circuit (IC) foundry includes various equipment and processes that are leveraged in order to incorporate the resistive memory into the backend of line process. The inventors of the present disclosure are familiar with backend material compatibility issues associated there with. The one or more disclosed aspects can perform the process of fabricating the resistive memory device in a relatively simple manner compared to other resistive memory fabrication processes. For example, a common material(s), or common process step(s) can be employed in fabricating differently configured memory arrays (e.g., 1T1R, 1TnR) disclosed herein.

Further, one or more disclosed aspects can enable smaller die sizes and lower costs through one or more disclosed processes for monolithic integration of resistive memory onto a product of a frontend of line process (e.g., e.g., a MOS substrate, including CMOS, nMOS, or pMOS devices). Further, the fabrication of the resistive memory devices may be performed using standard IC foundry-compatible fabrication processes. Various embodiments can also be implemented without design changes after monolithic integration (e.g., over a CMOS device) to account for changes in parasitic structure. A parasitic structure is a portion of the device (e.g., memory device) that resembles in structure a different semiconductor device, which might cause the device to enter an unintended mode of operation. Further, in at least one disclosed embodiment, there is provided a product (e.g., a memory device) of a fabrication process that can comprise monolithic integration of resistive memory over a CMOS circuitry. Further, the fabrication process can comprise IC foundry-compatible processes in a further embodiment (e.g., new or different processes are not necessary, though in alternative embodiments future improvements to such processes should not be excluded from the scope of various aspects of the present disclosure). In addition, the disclosed aspects can be performed within a thermal budget of frontend of line devices.

In some embodiments, the active metal layer can comprise a metal nitride selected from the group consisting of: $TiN_x$, $TaN_x$, $AlN_x$, $CuN_x$, $WN_x$ and $AgN_x$, where x is a positive number. In other embodiments, the active metal layer can comprise a metal oxide selected from the group consisting of: $TiO_x$, $TaO_x$, $AlO_x$, $CuO_x$, $WO_x$ and $AgO_x$. In other embodiments, the active metal layer can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. In some embodiments, the switching layer can comprise a material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x. Various combinations of the above are envisioned and contemplated within the scope of embodiments of the present invention.

In an embodiment, the active metal layer can comprise a metal nitride: $MN_x$, e.g. AgNx, TiNx, AlNx, and the switching layer can comprise a metal nitride: $MN_y$, e.g. AgOy, TiOy, AlOy, where y and x are positive numbers, and in some cases y is larger than x. In another embodiment, the active metal layer can comprise a metal oxide: $MO_x$, e.g. AgOx, TiOx, AlOx, and the switching layer can comprise a metal oxide: $MO_y$. e.g. AgOy, TiOy, AlOy, where y and x are positive numbers, and in some cases y is larger than x. In still other embodiments, the metal compound of the active metal layer is selected from a first group consisting of: $MN_x$ (e.g., $AgN_x$, $TiN_x$, $AlN_x$), and the switching layer comprises $MO_y$, (e.g. $AgO_x$, $TiO_x$, $AlO_x$) or $SiO_y$, where x and y are typically non-stoichiometric values.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, integrated circuit device 100 is depicted that illustrates a blocking layer that, as one example function, mitigates diffusion of material of a metal layer for integrated circuit device 100, or in conjunction with integrated circuit fabrication techniques. For instance, blocking layer 104 can be formed overlying metal layer 102 of a two-terminal memory device. Metal layer 102 can be a diffusive metal, metal alloy or metal compound in various embodiments. As an illustrative case, metal layer 102 can be, e.g., copper (Cu) or another suitable material. In some embodiments, metal layer 102 can be a bitline or a wordline of an integrated circuit memory array, whereas in other embodiments metal layer 102 can be local to integrated circuit device 100, or local to a subset of the integrated circuit memory array.

Blocking layer 104 can comprises dielectric material 106. Dielectric material 106 can be a material selected to mitigate diffusion of the diffusive metal material such as copper or another diffusive material of metal layer 102. Dielectric material 106 can be referred to herein as blocking layer 104 and/or can represent a portion of a blocking layer 104. In some embodiments, dielectric material 106 can comprise nitrogen doped carbide (NDC), SiN, a silicon carbide compound, SiCN, SiON, an amorphous silicon, or the like. In some embodiments, dielectric material 106 is a single layer, while in other embodiments, dielectric material 106 comprises multiple layers of different materials.

In some embodiments, metal layer 102 can be formed on or overly substrate 106. In some embodiments, intervening layers (not shown) can be formed between metal layer 102 and substrate 106. In some embodiments, metal layer 102 and blocking layer 104 can be formed in front-end-of-line processing layers over substrate 106 and/or over one or more optional intervening layers. In some embodiments, metal layer 102 and blocking layer 104 can be formed in back-end-of-line processing layers over substrate 106 and/or one or more intervening layers. In some embodiments, metal layer 102 and blocking layer 104 can be provided as part of another suitable integrated circuit fabrication process.

Figure 2A:
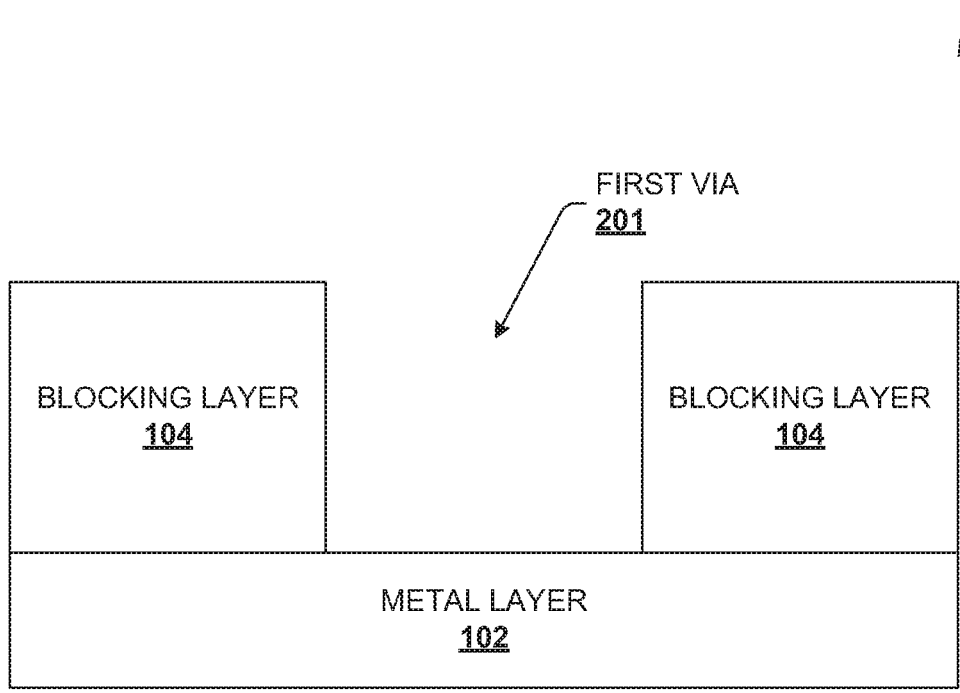
FIG. 2A illustrates an example integrated circuit device that provides for forming a via in the blocking layer in accordance with certain embodiments of this disclosure.

FIG. 2A depicts an integrated circuit device 200A having a first via 201 formed in the blocking layer 104 of integrated circuit device 100. Repetitive description of like elements employed in other embodiments described herein is omitted for sake of brevity. First via 201 can be formed in response to a pattern and etching process. Formation of first via 201 can expose a (top) surface of metal layer 102 of integrated circuit device 100. In some embodiments, sidewalls of blocking layer 104 adjacent to and exposed by via 201 can be sloped (not shown), rather than vertical. In other embodiments, the sidewalls of blocking layer 104 can be perpendicular or substantially perpendicular to the exposed surface of metal layer 102, as shown.

Figure 2B:
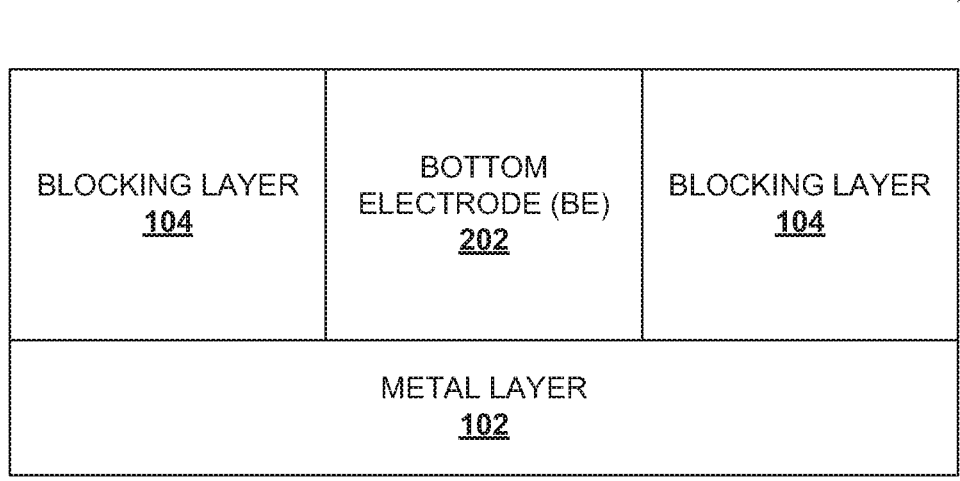
FIG. 2B illustrates an example integrated circuit device illustrating formation of a bottom electrode in the via in accordance with certain embodiments of this disclosure.

FIG. 2B depicts an integrated circuit device 200B comprising a bottom electrode formed within the first via 201 of integrated circuit device 200A of FIG. 2, supra. Repetitive description of like elements employed in other embodiments described herein is omitted for sake of brevity. For example, bottom electrode 202 can be deposited or otherwise formed in first via 201. Bottom electrode (BE) 202 can comprise an electrical conductive material and can be in contact (e.g., electrical contact, direct contact, etc.) with metal layer 102 and adjacent portions of blocking layer 104. As formed, a top surface of bottom electrode (BE) 202 and a top surface of blocking layer 104 can form a substantially common surface, as illustrated.

Figure 3:
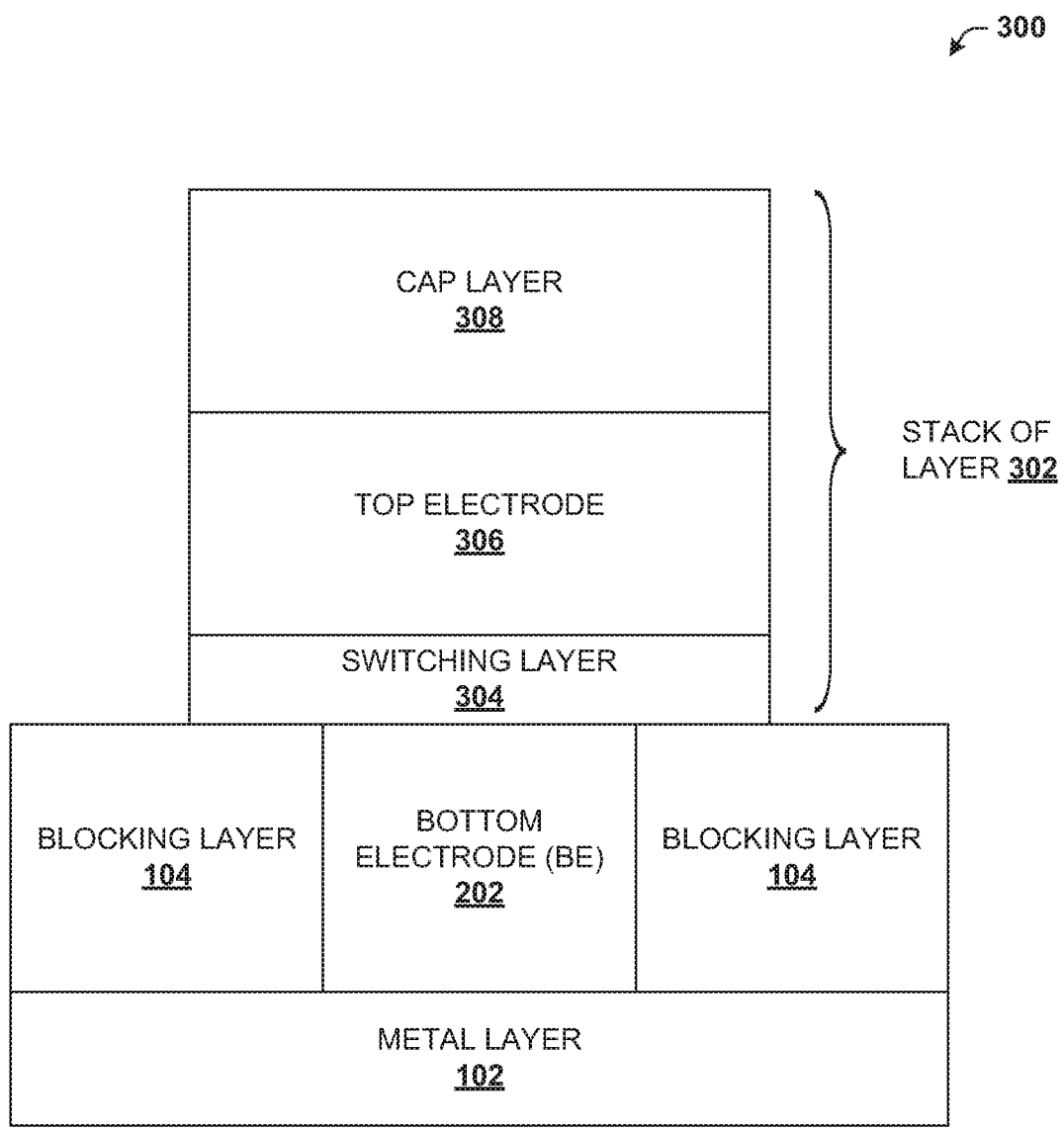
FIG. 3 depicts a block diagram of an example integrated circuit device that provides for formation of a stack of layers overlying the bottom electrode in accordance with certain embodiments of this disclosure.

Turning now to FIG. 3, integrated device 300 is depicted. Integrated device 300 provides for formation of a stack of layers 302 overlying integrated device 200B, including the BE 202. Repetitive description of like elements employed in other embodiments described herein is omitted for sake of brevity. Stack of layers 302 and BE 202 can be formed as a pillar and collar configuration, as shown (e.g., with BE 202 serving as a relatively narrow pillar underlying stack of layers 302 which serve as a relatively wider collar of the pillar and collar configuration), as a monolithic stack, or any other suitable configuration. Stack of layers 302 can comprise switching layer 304, as depicted. Switching layer 304 can be overlying and in contact with BE 202 in one or more embodiments. In alternative or additional embodiments, one or more intervening layers can be provided between switching layer 304 and BE 202 (e.g., including an electrical contact layer(s), a diffusion blocking layer(s), an adhesion layer(s), a silicon containing layer(s) to control defect density of switching layer 304, or the like, or a suitable combination thereof).

Stack of layers 302 can comprise top electrode 306 that can be overlying and in contact with switching layer 304 in an embodiment. In alternative or additional embodiments, one or more intervening layers can be provided between top electrode 306 and switching layer 304 (e.g., electrical contact layer(s), diffusion blocking layer(s), adhesion layer(s), ion conduction layer(s), or the like, or a suitable combination thereof). Stack of layers 302 can comprise cap layer 308 that can be overlying and in contact with top electrode 306 (optionally comprising one or more suitable intervening layers). In some embodiments, cap layer 308 can comprises titanium nitride (TiN).

Figure 4:
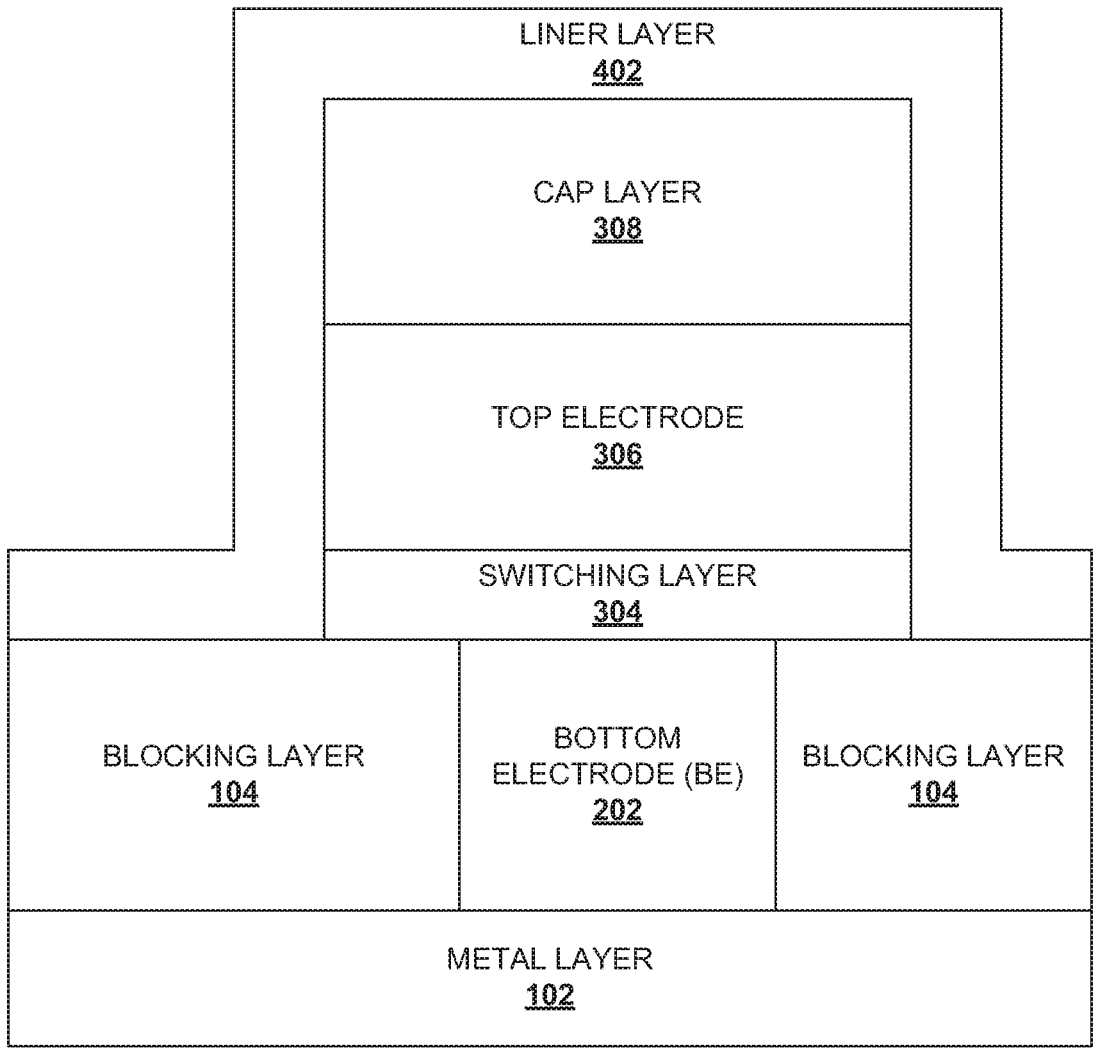
FIG. 4 depicts a block diagram of an example integrated circuit device illustrating an example liner layer that overlies the stack of layers and the blocking layer in accordance with certain embodiments of this disclosure.

Referring now to FIG. 4, integrated circuit device 400 is illustrated. Integrated circuit device 400 depicts an example liner layer 402 that overlies the stack of layers 302 and the blocking layer 104. Repetitive description of like elements employed in other embodiments described herein is omitted for sake of brevity. Some other devices or integrated circuit processing techniques, when constructing a liner, utilize low-temperature oxide (LTO) for the liner. LTO can facilitate suiable adherence of a subsequently deposited dielectric material. However, the use of LTO has certain disadvantages. For example, LTO is very oxidizing, so in cases where the LTO is in contact with or proximal to a two-terminal memory device switching layer (e.g., switching layer 304), use of LTO can affect switching characteristics of the switching layer, which can be undesirable. As another potential disadvantage, LTO has a different etch rate relative to common dielectrics used during fabrication of some two-terminal memory devices. As one potential result, a pattern and etching process that is intended to expose a top portion of the two-terminal memory device (e.g., for a wordline) and also expose a bitline (e.g., for another memory cell or switching device), may be difficult to properly etch. For example, etching may be difficult due to the differing etch rates between LTO (e.g., adjacent to the top portion of the two-terminal memory device) and dielectrics (e.g., adjacent to the bitline), such as dielectric material 106 that can be included in blocking layer 104.

In some embodiments, liner layer 402 can be configured to comprise a same material used for blocking layer 104. For example, both liner layer 402 and blocking layer 104 can be comprised of dielectric material 106. In some embodiments, such can provide an advantage of sealing off switching layer 304 to prevent or mitigate undesired oxidation, undesired alteration of switching characteristics, or other undesired results. As another potential advantage for some embodiments, etch rates for certain etching procedures can be the same or more similar between different layers, which is further detailed below.

In some embodiments, dielectric material 106 can be a high-K dielectric material, where K can represent a relative permittivity of dielectric material 106. Relative permittivity can be measured as a ratio of capacitance of a capacitor using the subject material (e.g., the high-K dielectric) as a dielectric to the capacitance of a capacitor using a vacuum as a dielectric. In some embodiments, a high-K dielectric can be any suitable material with a K value that is equal or greater than about 7.0. Non-limiting examples of a high-K material can be, e.g., $AlO_x$, $Al_2O_3$, $HfO_2$, $HfO_x$, $HfSiO_4$, $HfSiO_x$, $HfSiON$, $Ta_2O_5$, $TaO_x$, $TiO_2$, $TiO_x$, $ZrO_2$, and/or $ZrO_x$. Other non-limiting examples of the high-K material can also include $HfZrO_4$, $ZrSiO_4$, $LaAlO_3$, $Sc_2O_3$, $Y_2O_3$, $La_2O_3$, $Lu_2O_3$, $Nb_2O_5$, $Gd_2O_3$, $BaTiO_3$, $BaSrTiO_3$, and/or $PbTiO_3$. In some other embodiments, the high-K material can be either stoichiometric or non-stoichiometric depending on the implementation.

Since, in some embodiments, blocking layer 104 and liner layer 402 can both comprise dielectric material 106, both block layer 104 and liner layer 402 can comprise a high-K dielectric material. In some embodiments, switching layer 304 can comprise at least in part a high-K dielectric material. In some embodiments, the high-K dielectric material included in switching layer 304 can be the same high-K dielectric material included in liner layer 402 and/or blocking layer 104. In other embodiments, the high-K dielectric material included in switching layer 304 can differ from the high-K dielectric material included in liner layer 402 and/or blocking layer 104. It is understood that in some embodiments, liner layer 402 can comprise a same material as switching layer 304, which can be a high-K dielectric. Such can facilitate compatibility between liner layer 402 and switching layer 304, which can dramatically improve long-term stability and performance of an associated two-terminal memory device.

Figure 5:
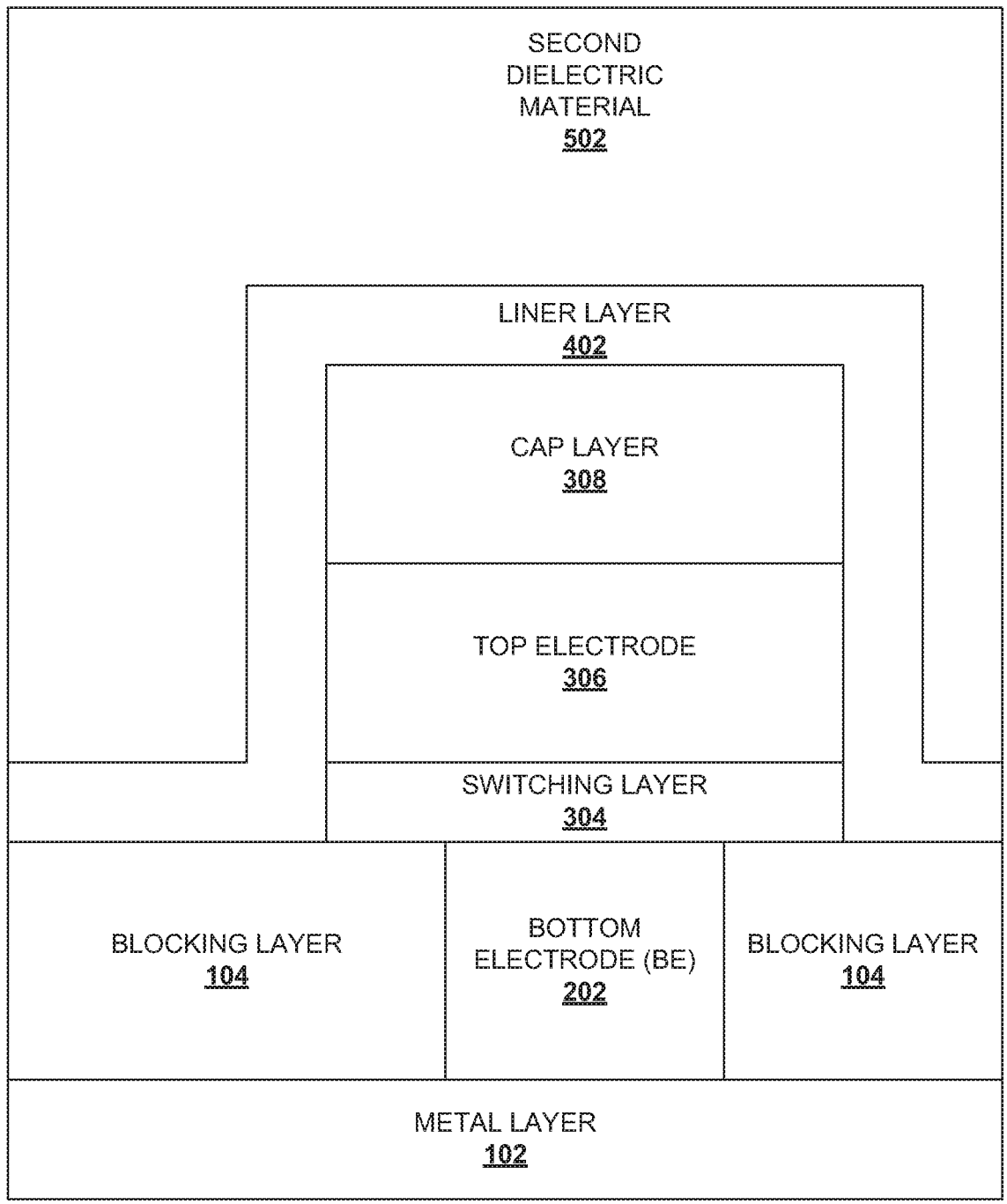
FIG. 5 illustrates a block diagram of an example integrated circuit device that provides for forming a second dielectric material in accordance with certain embodiments of this disclosure.

FIG. 5 illustrates an integrated circuit device 500 having a second dielectric material 502 formed there on. Repetitive description of like elements employed in other embodiments described herein is omitted for sake of brevity. For example, second dielectric material 502 can be formed overlying liner layer 402. In some embodiments, second dielectric material 502 can comprise SiCN, SiON, or a black diamond compound. In some embodiments, second dielectric material 502 can comprise dielectric material 106.

Figure 6:
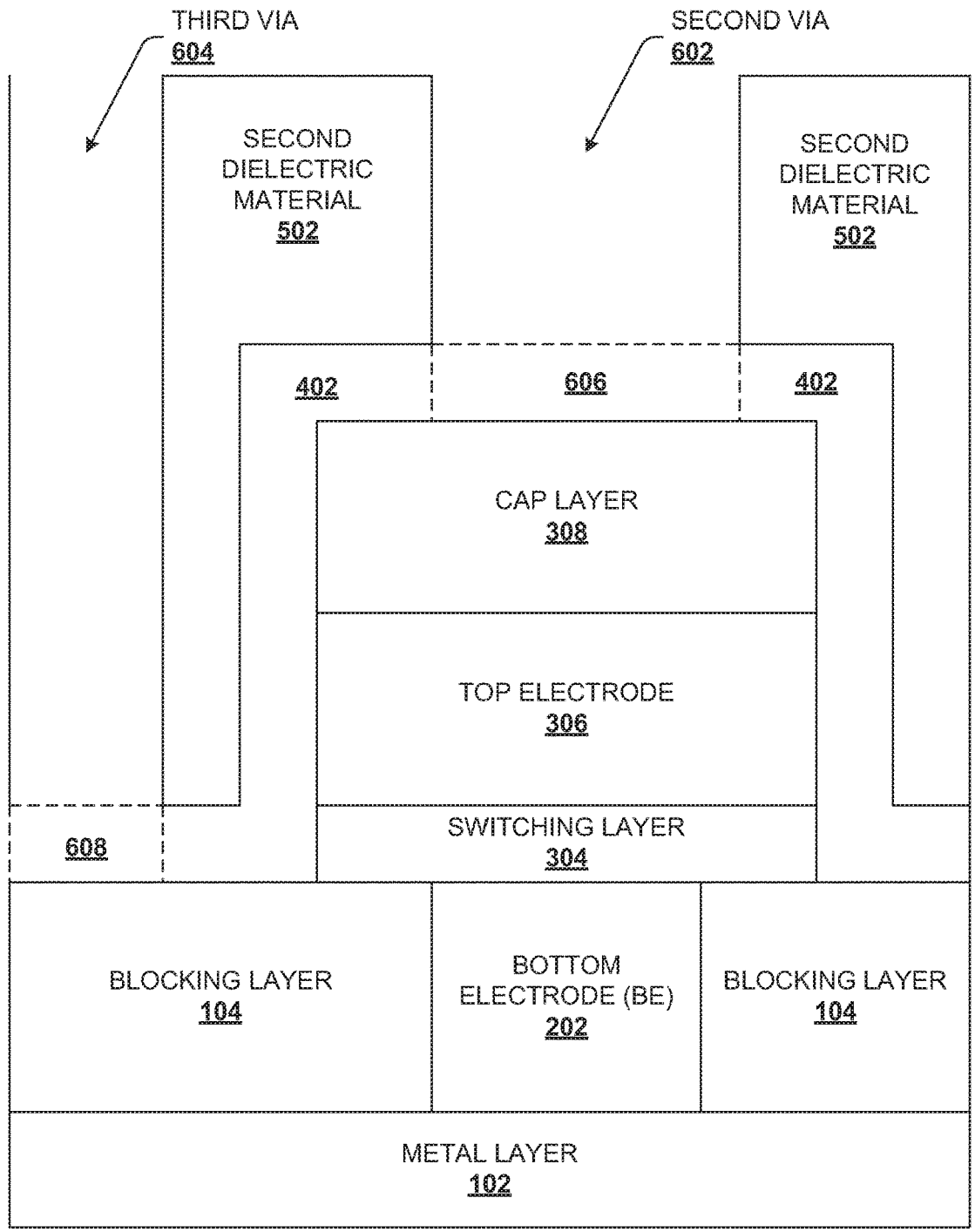
FIG. 6 illustrates a block diagram of an example integrated circuit device that depicts an example after a first etching procedure in accordance with certain embodiments of this disclosure.

Referring now to FIG. 6, integrated circuit device 600 is illustrated. Integrated circuit device 600 depicts an example after a first etching procedure. Repetitive description of like elements employed in other embodiments described herein is omitted for sake of brevity. The first etching procedure can remove various portions of second dielectric 502. The first etching procedure can form a second via 602 in second dielectric 502 that exposes a first portion 606 of liner layer 402. The first etching procedure can form a third via 604 in second dielectric 502 that exposes a second portion 608 of liner layer 402. The first etching procedure can be configured to stop in response to contact with liner layer 402.

Figure 7:
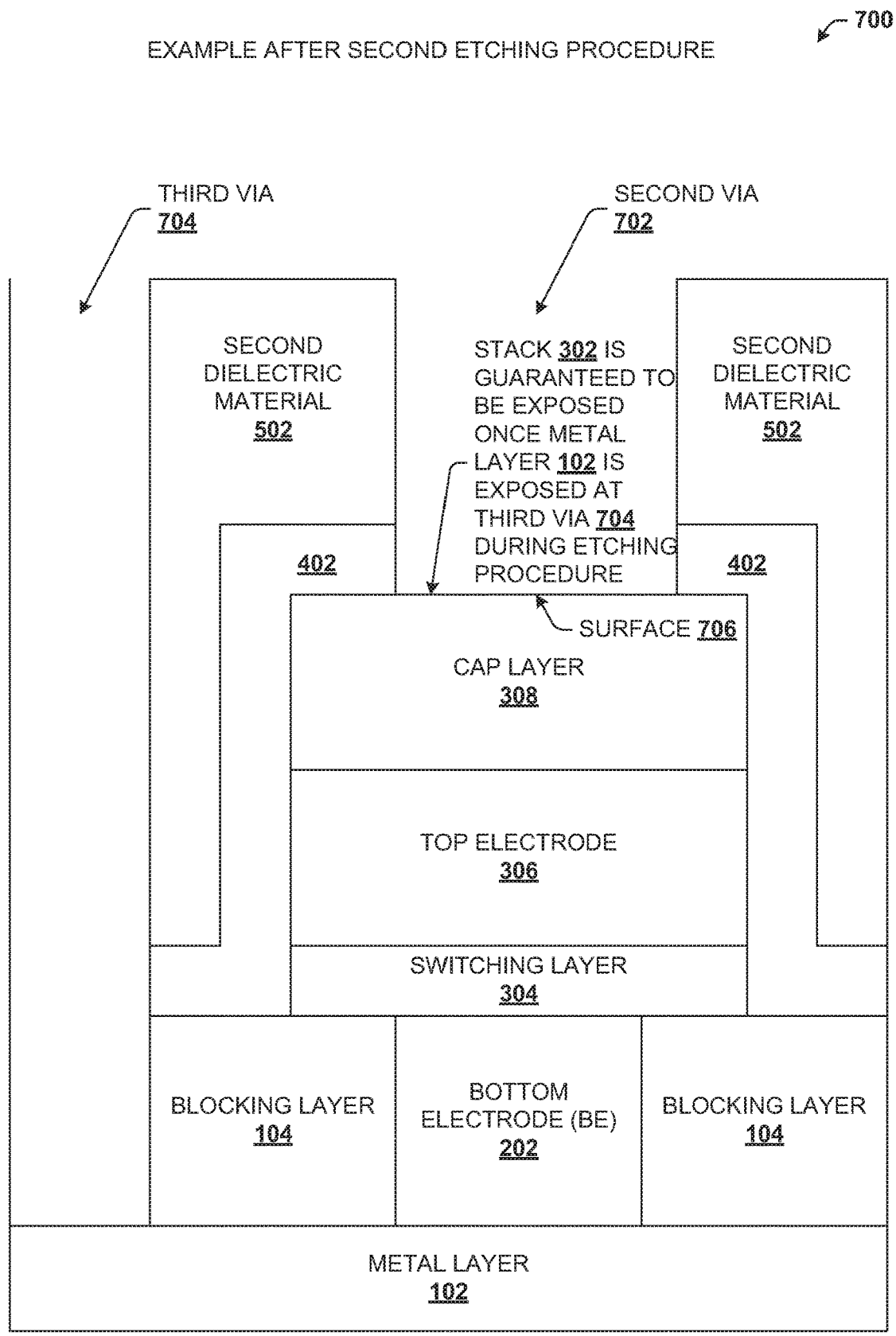
FIG. 7 illustrates a block diagram of an example integrated circuit device that represent an example after a second etching procedure in accordance with certain embodiments of this disclosure.

With reference now to FIG. 7, integrated circuit device 700 is illustrated. Integrated circuit device 700 can represent an example after a second etching procedure. Repetitive description of like elements employed in other embodiments described herein is omitted for sake of brevity. The second etching procedure can remove first portion 606 of liner layer 402 and second portion 608 of liner layer 402. In some embodiments, second etching procedure may remove a portion of stack of layers 302 such as a portion of cap layer 308. In some embodiments, the second etching procedure can expose surface 706, which can be a top surface of stack of layers 302 and/or a top surface of cap layer 308. In some embodiments, surface 706 can be free of or substantially free of material of liner layer 402 (e.g., first portion 606 of liner layer 402 can be entirely removed by the second etching procedure). It is understood that second etching procedure can increase the sizes of second via 602 and third via 604 illustrated at FIG. 6, which are depicted here as second via 702 and third via 704.

In some embodiments, the second etching procedure can remove a portion of blocking layer 104, as depicted. Such can expose metal layer 102 to third via 704, as shown. Hence, with respect to third via 704, second etching procedure can remove a portion (e.g., 608) of liner layer 402 and a portion of blocking layer 104. Since the two portions can comprise the same material (e.g., dielectric material 104), associated etch rates can be substantially identical or similar. Thus, in some embodiments, once metal layer 102 is exposed to third via 704, stack 302 and/or surface 706 can be virtually certain to be exposed to second via 702 and/or virtually certain to be free of material comprising liner layer 402. Such can be the case because the etch rate for liner 402 is substantially the same at the portions (e.g., 606) being opened to form via 702 and the portions (e.g., 608) being opened to form via 704.

Hence, once blocking layer is exposed in third via 704 by the second etching procedure, a similar amount of material is likely to have been removed from liner layer 402 at second via 702, thereby exposing surface 706 to a similar degree. Moreover, because in some embodiments blocking layer 104 can comprise the same material as liner layer 402, and therefore have a substantially similar etch rate, once portions of blocking layer 104 are removed by the second etching procedure to expose metal layer 102 in third via 704, then it can be assumed that corresponding etching occurring in second via 702 will have removed all remaining material of liner layer 402, beyond simply exposing surface 706. Without undesired material littering surface 706, such can provide exceptional contact with cap layer 308 and/or stack 302 for a subsequently formed layer, which is exemplified at FIG. 8.

Figure 8:
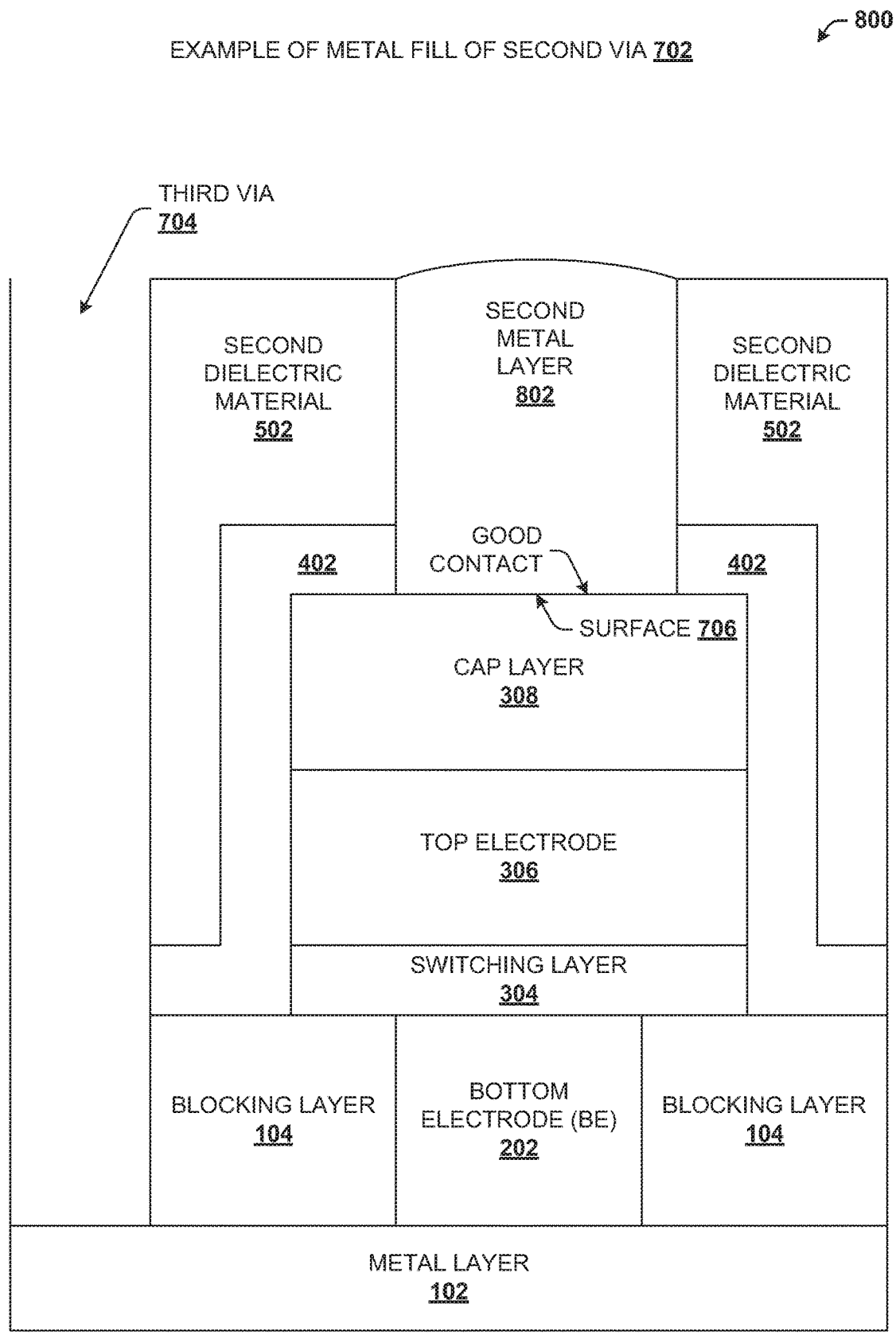
FIG. 8 illustrates a block diagram of an example integrated circuit device illustrating an example fill of the second via with good contact to the stack of layers in accordance with certain embodiments of this disclosure.

Referring now to FIG. 8, integrated circuit device 800 is depicted. Repetitive description of like elements employed in other embodiments described herein is omitted for sake of brevity. Integrated circuit device 800 illustrates an example fill of the second via after the second etching procedure. For example, second metal layer 802 can be deposited or otherwise formed in second via 702. In some embodiments, second metal layer 802 can be or can connect to a backend metal layer such as a wordline, bitline, or the like. In some embodiments, since surface 706 can be substantially free of material comprising liner layer 402, contact between second metal layer 802 and surface 706 can be good and/or can facilitate desired electrical contact characteristics or other desired characteristics.

Figure 9:
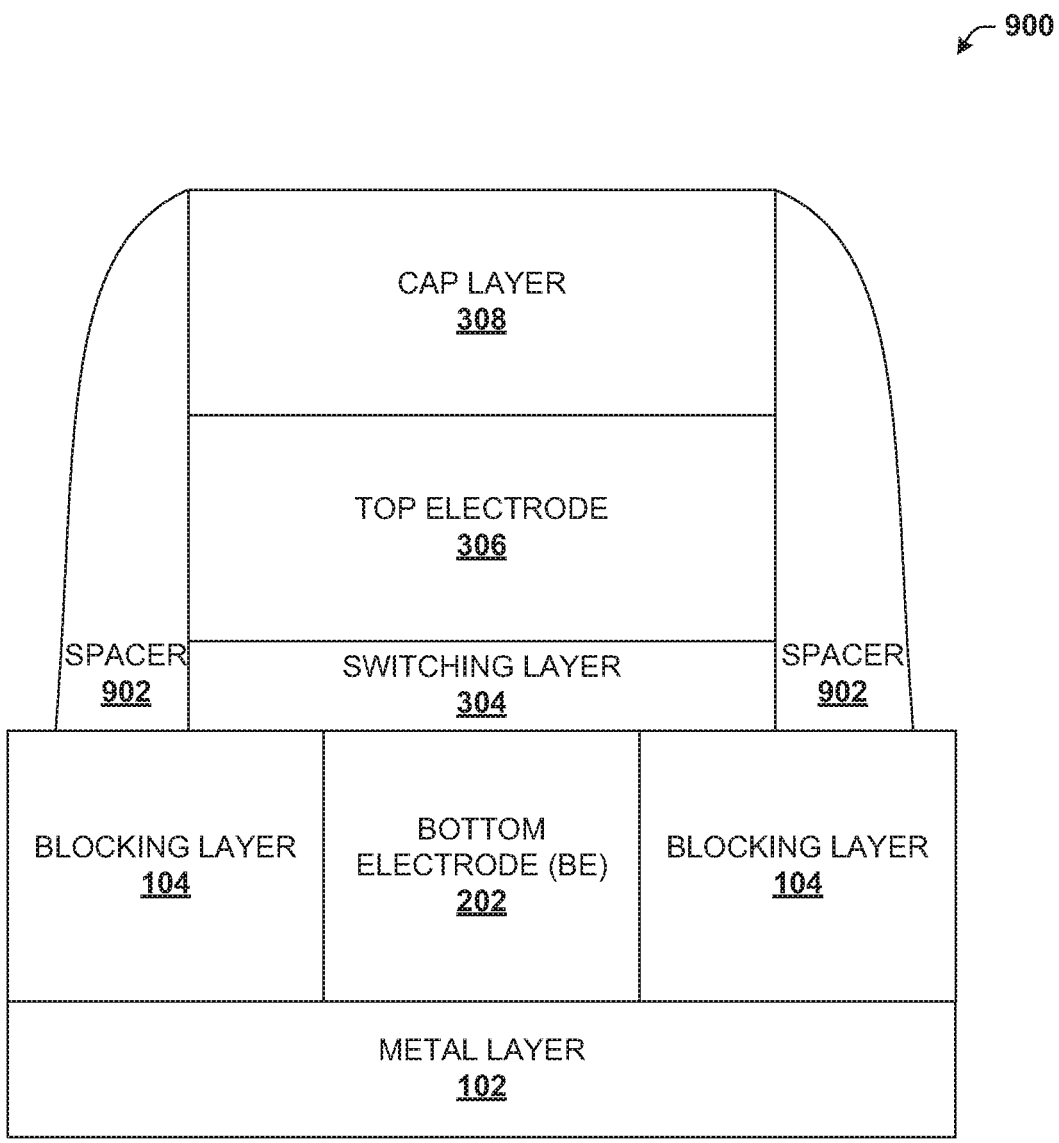
FIG. 9 illustrates a block diagram of an example integrated circuit device illustrating an example two-terminal memory device having a spacer in accordance with certain embodiments of this disclosure.

Turning now to FIG. 9, integrated circuit device 900 is presented. Integrated circuit device 900 illustrates an example two-terminal memory device having a spacer. Repetitive description of like elements employed in other embodiments described herein is omitted for sake of brevity. In some embodiments, integrated circuit device 900 can be substantially similar to integrated circuit device 400 of FIG. 4. However, rather than liner layer 402, integrated circuit device 900 can comprises, either additionally or alternatively, one or more spacers 902. Spacer 902 can overly blocking layer 104 and can be adjacent to stack of layers 302. In some embodiments, spacer 902 can be substantially similar in composition to liner layer 402. For example, spacer 902 can comprise dielectric material 106, which can be, in some embodiments, a high-K dielectric material.

In some embodiments, the one or more spacers 902 can be formed in response to an anisotropic spacer etch, which can be applied to previously deposited layer such as liner layer 402. For example, the anisotropic spacer etch can be applied to integrated circuit device 400 or a similar system or device to yield integrated circuit device 900 or similar. In essence, the anisotropic spacer etch can transform liner layer 402 into spacer(s) 902.

The diagrams included herein are described with respect to interaction between several components of a memory device or an integrated circuit device, or memory architectures comprising one or more memory devices or integrated circuit devices. It should be appreciated that such diagrams can include those components, devices and architectures specified therein, some of the specified components/devices, or additional components/devices. Sub-components can also be implemented as electrically connected to other sub-components rather than included within a parent device. Additionally, it is noted that one or more disclosed processes can be combined into a single process providing aggregate functionality. For instance, a deposition process can comprise an etching process, or vice versa, to facilitate depositing and etching a component of an integrated circuit device by way of a single process. Components of the disclosed architectures can also interact with one or more other components not specifically described herein but known by those of skill in the art.

Figure 10:
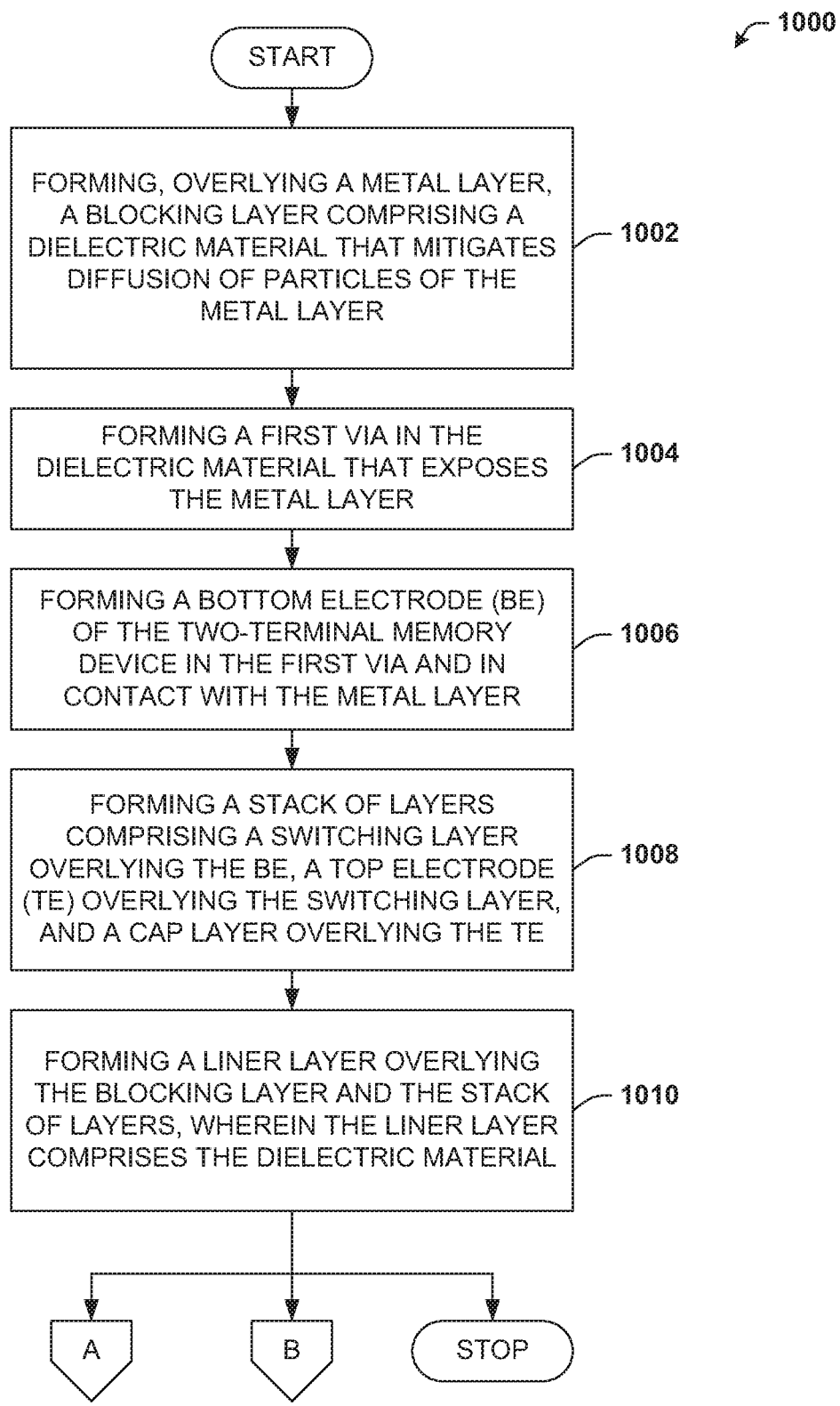
FIG. 10 illustrates an example methodology that can provide for fabrication of a two-terminal memory device having a liner layer and blocking layer with similar composition in accordance with certain embodiments of this disclosure.
Figure 11:
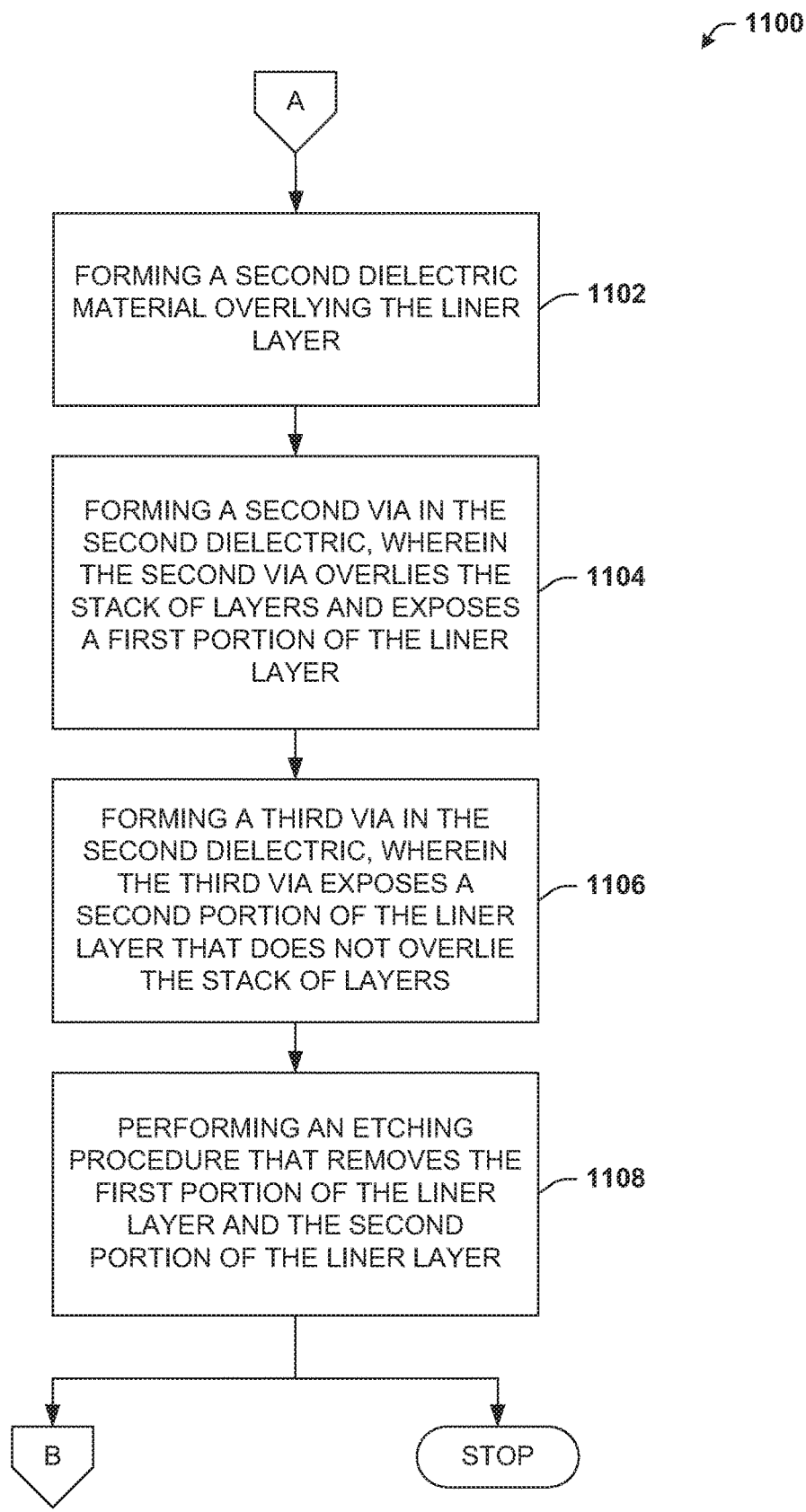
FIG. 11 illustrates an example methodology that can provide for additional elements or aspects in connection with fabrication of a two-terminal memory device having a liner layer and blocking layer with similar composition in accordance with certain embodiments of this disclosure.
Figure 12:
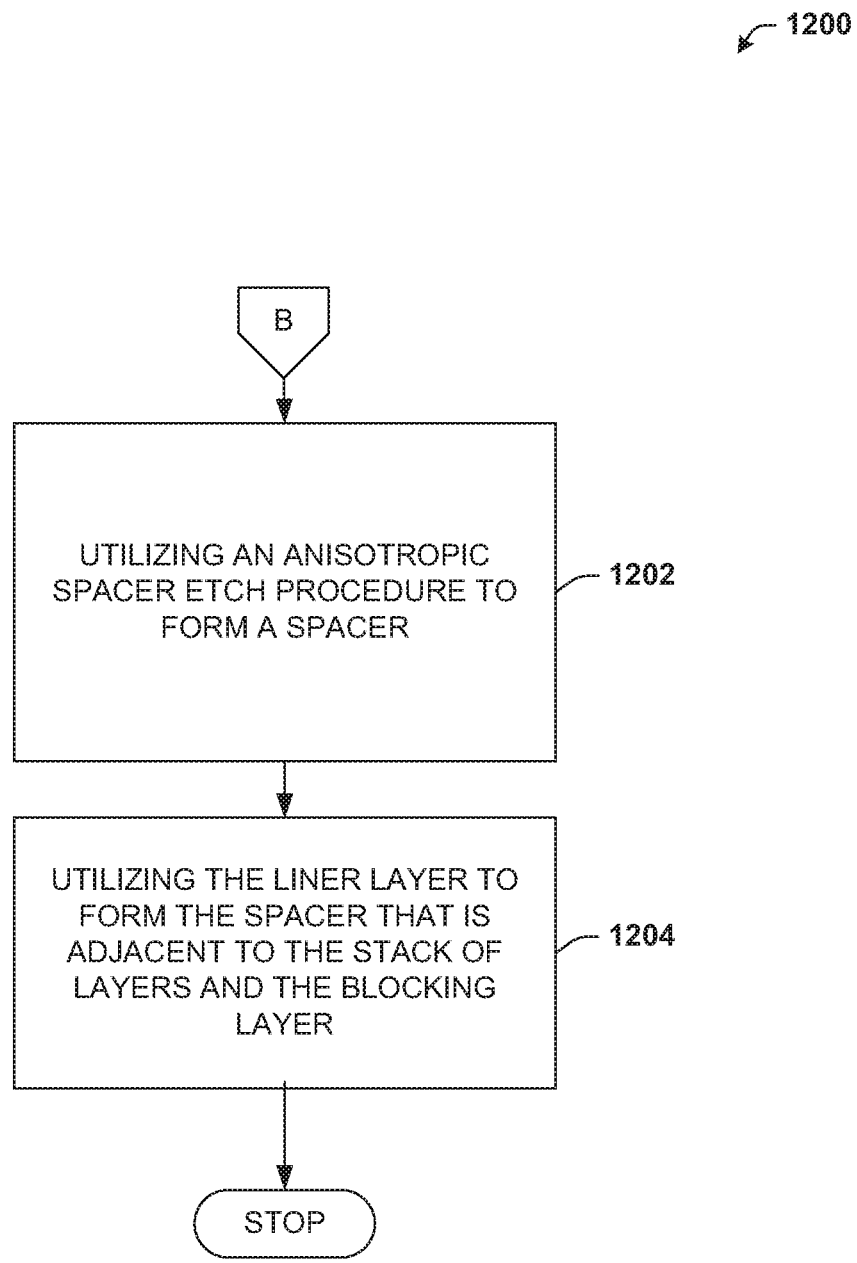
FIG. 12 illustrates an example methodology that can provide for fabrication of a two-terminal memory device having a spacer and blocking layer with similar composition in accordance with certain embodiments of this disclosure.

In view of the exemplary diagrams described supra, process methods that can be implemented in accordance with the disclosed subject matter will be better appreciated with reference to the flow charts of FIGS. 10-12. While for purposes of simplicity of explanation, the methods of FIGS. 10-12 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 10, exemplary method 1000 is illustrated. Method 1000 can provide for fabrication of a two-terminal memory device having a liner layer and blocking layer with similar composition. For example, at reference numeral 1002, a two-terminal memory fabrication device can form a blocking layer over a metal layer. The metal layer can represent a bitline, wordline, or the like and can in some embodiments comprise copper or another suitable material. The blocking layer can comprise a dielectric material that mitigates diffusion of particles of the metal layer. Thus, in some embodiments, for example during subsequent fabrication processes, the blocking layer can prevent a switching layer of the two-terminal memory device from being contaminated with metal material from the metal layer.

At reference numeral 1004, the fabrication device can form a first via in the dielectric material of the blocking layer. The first via can expose the metal layer. At reference numeral 1006, the fabrication device can form a bottom electrode (BE) of the two-terminal memory device in the first via. The BE can be adjacent to and in contact with the metal layer and the blocking layer. For example, the BE can overlie the metal layer and be adjacent to sidewalls of the blocking layer.

At reference numeral 1008, the fabrication device can form a stack of layers overlying the BE. In some embodiments, the stack of layers can overlie at least a portion of the blocking layer, e.g., in a pillar and collar configuration as illustrated at FIG. 3. The stack of layers can comprise a switching layer, a top electrode (TE) and a cap layer. The switching layer can overlie the BE, the TE can overlie the switching layer, and the cap layer can overlie the TE. At reference numeral 1010, the fabrication device can form a liner layer overlying the blocking layer and the stack of layers. The liner layer can comprise the dielectric material that composes the blocking layer. Hence, the liner layer can, in some embodiments, have an etch rate that is identical or substantially similar to an etch rate for the blocking layer.

Turning now to FIG. 11, exemplary method 1100 is illustrated. Method 1100 can provide for additional elements or aspects in connection with fabrication of a two-terminal memory device having a liner layer and blocking layer with similar composition. At reference numeral 1102, the fabrication device can form a second dielectric material overlying the liner layer. The second dielectric material can be the same or different from the dielectric material, depending on the embodiment. A representative example of the second dielectric can be second dielectric material 502 of FIG. 5. At reference numeral 1104, the fabrication device can form a second via in the second dielectric material. The second via can overlay the stack of layers. A representative example of the second via can be second via 602 of FIG. 6. The second via can expose a first portion of the liner layer (e.g., portion 606 depicted at FIG. 6). At reference numeral 1106, the fabrication device can form a third via in the second dielectric material. A representative example of the third via can be third via 604 of FIG. 6. The third via can expose a second portion of the liner layer (e.g., portion 608 depicted at FIG. 6) that does not overlie the stack of layers.

At reference numeral 1108, the fabrication device can perform an etching procedure that removes the first portion (e.g., portion 606) and the second portion (e.g., portion 608) of the liner layer. Such a procedure can expose a top surface of stack of layers within the second via and a top surface of the metal layer within the third via. It is understood that because the liner layer and the blocking layer can comprise similar material, in some embodiments, those two layers will have the same or substantially similar etch rates. Because the etch rates can be the same or similar, upon reaching the metal layer within the third via, it can be exceedingly likely that the top surface of the stack of layers is free of all liner layer material. Thus, exceptional contact can be provided between the stack of layers and subsequently formed elements.

Turning now to FIG. 12, exemplary method 1200 is illustrated. Method 1100 can provide for fabrication of a two-terminal memory device having a spacer and blocking layer with similar composition. With regard to method 1200, it can be assumed that all or a portion of method 1000 has completed. In other words, method 1200 can operate on an integrated circuit device similar to that depicted in FIG. 3 or FIG. 4.

At reference numeral 1202, the fabrication device can utilize an anisotropic spacer etch procedure to form one or more spacers. In some embodiments, the fabrication device can utilize the liner layer to form the spacer(s). For example, the anisotropic etch procedure can remove material of the liner layer from the top surface of the stack of layers, and can, in some embodiments shape the spacer(s) to a degree. The spacer(s) can be adjacent to and in contact with the sidewalls of the stack of layers. The spacer(s) can overlie and be in contact with one or more portions of the blocking layer. A representative example of the spacer(s) can be spacers 902 of FIG. 9.

Example Operating Environments

Figure 13:
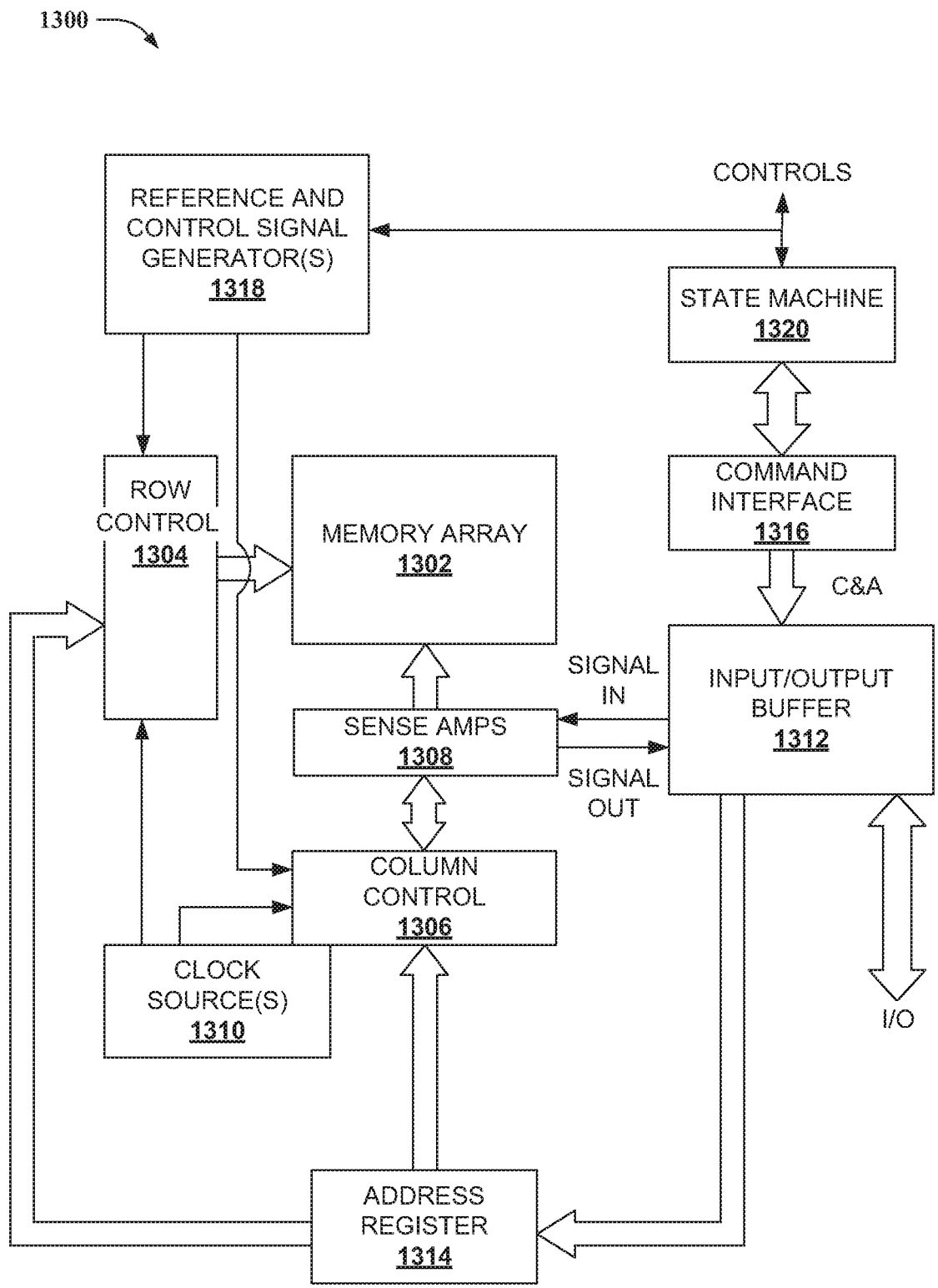
FIG. 13 illustrates a block diagram of an example electronic operating environment in accordance with certain embodiments of this disclosure.

FIG. 13 illustrates a block diagram of an example operating and control environment 1300 for a memory array 1302 of a memory cell array according to aspects of the subject disclosure. In at least one aspect of the subject disclosure, memory array 1302 can comprise memory selected from a variety of memory cell technologies. In at least one embodiment, memory array 1302 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing.

A column controller 1306 and sense amps 1308 can be formed adjacent to memory array 1302. Moreover, column controller 1306 can be configured to activate (or identify for activation) a subset of bit lines of memory array 1302. Column controller 1306 can utilize a control signal provided by a reference and control signal generator(s) 1318 to activate, as well as operate upon, respective ones of the subset of bitlines, applying suitable program, erase or read voltages to those bitlines. Non-activated bitlines can be kept at an inhibit voltage (also applied by reference and control signal generator(s) 1318), to mitigate or avoid bit-disturb effects on these non-activated bitlines.

In addition, operating and control environment 1300 can comprise a row controller 1304. Row controller 1304 can be formed adjacent to and electrically connected with word lines of memory array 1302. Also utilizing control signals of reference and control signal generator(s) 1318, row controller 1304 can select particular rows of memory cells with a suitable selection voltage. Moreover, row controller 1304 can facilitate program, erase or read operations by applying suitable voltages at selected word lines.

Sense amps 1308 can read data from, or write data to the activated memory cells of memory array 1302, which are selected by column control 1306 and row control 1304. Data read out from memory array 1302 can be provided to an input/output buffer 1312. Likewise, data to be written to memory array 1302 can be received from the input/output buffer 1312 and written to the activated memory cells of memory array 1302.

A clock source(s) 1308 can provide respective clock pulses to facilitate timing for read, write, and program operations of row controller 1304 and column controller 1306. Clock source(s) 1308 can further facilitate selection of word lines or bit lines in response to external or internal commands received by operating and control environment 1300. Input/output buffer 1312 can comprise a command and address input, as well as a bidirectional data input and output. Instructions are provided over the command and address input, and the data to be written to memory array 1302 as well as data read from memory array 1302 is conveyed on the bidirectional data input and output, facilitating connection to an external host apparatus, such as a computer or other processing device (not depicted, but see e.g., computer 1002 of FIG. 10, infra).

Input/output buffer 1312 can be configured to receive write data, receive an erase instruction, receive a status or maintenance instruction, output readout data, output status information, and receive address data and command data, as well as address data for respective instructions. Address data can be transferred to row controller 1304 and column controller 1306 by an address register 1310. In addition, input data is transmitted to memory array 1302 via signal input lines between sense amps 1308 and input/output buffer 1312, and output data is received from memory array 1302 via signal output lines from sense amps 1308 to input/output buffer 1312. Input data can be received from the host apparatus, and output data can be delivered to the host apparatus via the I/O bus.

Commands received from the host apparatus can be provided to a command interface 1316. Command interface 1316 can be configured to receive external control signals from the host apparatus, and determine whether data input to the input/output buffer 1612 is write data, a command, or an address. Input commands can be transferred to a state machine 1320.

State machine 1320 can be configured to manage programming and reprogramming of memory array 1302 (as well as other memory banks of a multi-bank memory array). Instructions provided to state machine 1320 are implemented according to control logic configurations, enabling state machine to manage read, write, erase, data input, data output, and other functionality associated with memory cell array 1302. In some aspects, state machine 1320 can send and receive acknowledgments and negative acknowledgments regarding successful receipt or execution of various commands. In further embodiments, state machine 1320 can decode and implement status-related commands, decode and implement configuration commands, and so on.

To implement read, write, erase, input, output, etc., functionality, state machine 1320 can control clock source(s) 1308 or reference and control signal generator(s) 1318. Control of clock source(s) 1308 can cause output pulses configured to facilitate row controller 1304 and column controller 1306 implementing the particular functionality. Output pulses can be transferred to selected bit lines by column controller 1306, for instance, or word lines by row controller 1304, for instance.

In connection with FIG. 14, the systems, devices, and/or processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 14:
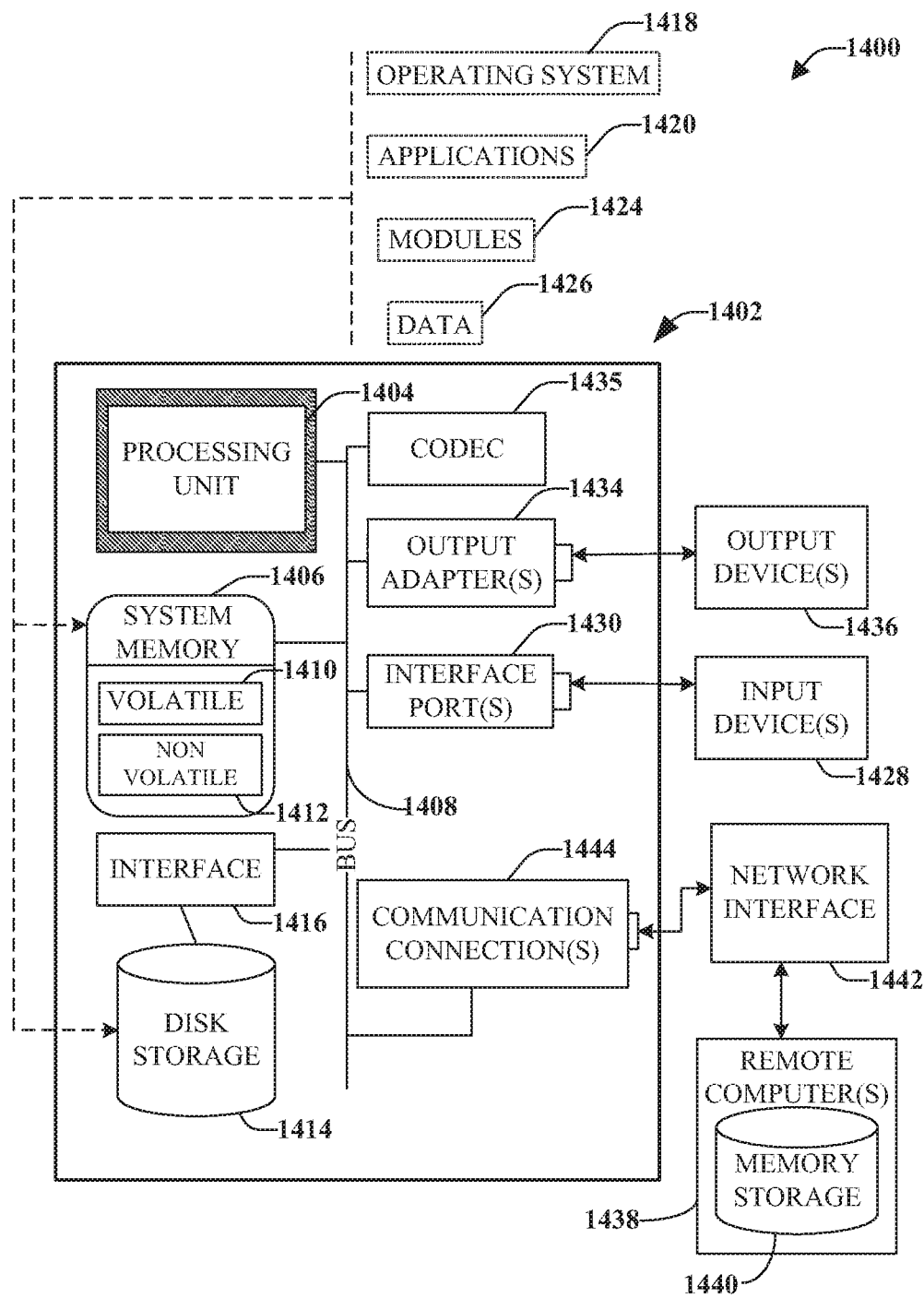
FIG. 14 illustrates a block diagram of an example computing environment in accordance with certain embodiments of this disclosure.

With reference to FIG. 14, a suitable environment 1400 for implementing various aspects of the claimed subject matter includes a computer 1402. The computer 1402 includes a processing unit 1404, a system memory 1406, a codec 1435, and a system bus 1408. The system bus 1408 couples system components including, but not limited to, the system memory 1406 to the processing unit 1404. The processing unit 1404 can be any of various available processors. Dual microprocessors and other multiprocessor architectures also can be employed as the processing unit 1404.

The system bus 1408 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1406 includes volatile memory 1410 and non-volatile memory 1412, which can employ one or more of the disclosed memory architectures, in various embodiments. The basic input/output system (BIOS), containing the basic routines to transfer information between elements within the computer 1402, such as during start-up, is stored in non-volatile memory 1412. In addition, according to present innovations, codec 1435 may include at least one of an encoder or decoder, wherein the at least one of an encoder or decoder may consist of hardware, software, or a combination of hardware and software. Although, codec 1435 is depicted as a separate component, codec 1435 may be contained within non-volatile memory 1412. By way of illustration, and not limitation, non-volatile memory 1412 can include read only memory (ROM), programmable ROM (PROM), electrically programmable ROM (EPROM), electrically erasable programmable ROM (EEPROM), or Flash memory. Non-volatile memory 1412 can employ one or more of the disclosed memory devices, in at least some embodiments. Moreover, non-volatile memory 1412 can be computer memory (e.g., physically integrated with computer 1402 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1410 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1402 may also include removable/non-removable, volatile/non-volatile computer storage medium. FIG. 14 illustrates, for example, disk storage 1414. Disk storage 1414 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1414 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1414 to the system bus 1408, a removable or non-removable interface is typically used, such as interface 1416. It is appreciated that storage devices 1414 can store information related to a user. Such information might be stored at or provided to a server or to an application running on a user device. In one embodiment, the user can be notified (e.g., by way of output device(s) 1436) of the types of information that are stored to disk storage 1414 or transmitted to the server or application. The user can be provided the opportunity to opt-in or opt-out of having such information collected or shared with the server or application (e.g., by way of input from input device(s) 1428).

It is to be appreciated that FIG. 14 describes software that acts as an intermediary between users and the basic computer resources described in the suitable operating environment 1400. Such software includes an operating system 1418. Operating system 1418, which can be stored on disk storage 1414, acts to control and allocate resources of the computer system 1402. Applications 1420 take advantage of the management of resources by operating system 1418 through program modules 1424, and program data 1426, such as the boot/shutdown transaction table and the like, stored either in system memory 1406 or on disk storage 1414. It is to be appreciated that the claimed subject matter can be implemented with various operating systems or combinations of operating systems.

A user enters commands or information into the computer 1402 through input device(s) 1428. Input devices 1428 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1404 through the system bus 1408 via interface port(s) 1430. Interface port(s) 1430 include, for example, a serial port, a parallel port, a game port, and a universal serial bus (USB). Output device(s) 1436 use some of the same type of ports as input device(s) 1428. Thus, for example, a USB port may be used to provide input to computer 1402 and to output information from computer 1402 to an output device 1436. Output adapter 1434 is provided to illustrate that there are some output devices 1436 like monitors, speakers, and printers, among other output devices 1436, which require special adapters. The output adapters 1434 include, by way of illustration and not limitation, video and sound cards that provide a means of connection between the output device 1436 and the system bus 1408. It should be noted that other devices or systems of devices provide both input and output capabilities such as remote computer(s) 1438.

Computer 1402 can operate in a networked environment using logical connections to one or more remote computers, such as remote computer(s) 1438. The remote computer(s) 1438 can be a personal computer, a server, a router, a network PC, a workstation, a microprocessor based appliance, a peer device, a smart phone, a tablet, or other network node, and typically includes many of the elements described relative to computer 1402. For purposes of brevity, only a memory storage device 1440 is illustrated with remote computer(s) 1438. Remote computer(s) 1438 is logically connected to computer 1402 through a network interface 1442 and then connected via communication connection(s) 1444. Network interface 1442 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1444 refers to the hardware/software employed to connect the network interface 1442 to the bus 1408. While communication connection 1444 is shown for illustrative clarity inside computer 1402, it can also be external to computer 1402. The hardware/software necessary for connection to the network interface 1442 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method of fabricating a two-terminal memory device, comprising:
 providing a substrate comprising a metal layer and a blocking layer overlying the metal layer, wherein the blocking layer comprises a dielectric material that mitigates diffusion of particles of the metal layer through the blocking layer;
 forming a via within the blocking layer that exposes a surface of the metal layer through the blocking layer;
 forming a bottom electrode in the via in electrical contact with the metal layer such that a top surface of the bottom electrode and a top surface of the blocking layer form a substantially common surface;
 forming a stack of layers comprising a switching layer overlying and in contact with the top surface of the bottom electrode and in contact with a portion of the top surface of the blocking layer, a top electrode overlying the switching layer, and a cap layer overlying the top electrode;

forming a spacer overlying the blocking layer, the stack of layers and a lateral surface of the stack of layers, wherein the spacer comprises the dielectric material that mitigates diffusion of particles of the metal layer;

forming a second dielectric material overlying the spacer; and etching with a first etch process portions of the second dielectric material to form a second via overlying the stack of layers and a third via overlying a portion of the blocking layer adjacent to the stack of layers, wherein the dielectric material of both the blocking layer and the spacer comprises a material selected from a first group consisting essentially of: nitrogen doped carbide (NDC), silicon nitride (SiN), amorphous silicon, SiON and a silicon carbide compound.

2. The method of claim 1, further comprising exposing a surface of the spacer overlying the stack of layers through the second dielectric material by way of the second via.

3. The method of claim 2, further comprising exposing a second surface of the spacer adjacent to the stack of layers through the second dielectric material by way of the third via.

4. The method of claim 1, further comprising stopping the etching with the first etch process in response to exposing the spacer with the first etch process.

5. The method of claim 1, further comprising etching with a second etch process a portion of the spacer overlying the stack of layers and exposing at least a portion of a surface of the cap layer in response to the second etch process.

6. The method of claim 5, further comprising exposing a surface of the blocking layer adjacent to the stack of layers in response to the second etch process.

7. The method of claim 6, further comprising exposing a surface of the metal layer adjacent to the stack of layers in response to the second etch process.

8. The method of claim 5, wherein the second etch process removes substantially all of the dielectric material of the spacer overlying the at least the portion of the surface of the cap layer in response to the second etch process.

9. The method of claim 8, further comprising forming a second metal layer within the second via and in contact with the at least the portion of the surface of the cap layer, forming electrical contact and physical contact between the second metal layer and the cap layer.

10. The method of claim 1, further comprising at least one of the following:

forming the metal layer of a second material that comprises copper metal; or forming the cap layer of a third material that comprises titanium nitride (TiN).

11. A method of fabricating a two-terminal resistive switching memory cell, comprising:

forming, overlying a metal layer, a blocking layer comprising a dielectric material that mitigates diffusion of particles of the metal layer;

forming a first via in the dielectric material of the blocking layer that exposes the metal layer;

forming a bottom electrode of the two-terminal resistive switching memory cell in the first via and in contact with the metal layer and providing a top surface of the bottom electrode and a top surface of the blocking layer to be substantially flat;

forming a stack of layers comprising a switching layer overlying and in contact with the top surface of the bottom electrode and in contact with a portion of the top surface of the blocking layer, a top electrode overlying the switching layer, and a cap layer overlying the top electrode;

forming a liner layer overlying the blocking layer and the stack of layers, wherein the liner layer comprises the dielectric material that mitigates diffusion of the particles of the metal layer;

forming a second dielectric material layer overlying the liner layer; and etching the second dielectric material layer and forming a via overlying the stack of layers and exposing a first portion of the liner layer with the via, and forming a second via overlying the blocking layer and adjacent the stack of layers and exposing a second portion of the liner layer with the second via, wherein the dielectric material of both the blocking layer and the liner layer comprises a material selected from a first group consisting essentially of: NDC, SiN, amorphous silicon, SiON and a silicon carbide compound.

12. The method of claim 11, further comprising stopping the etching of the second dielectric material in response to exposure of the liner layer through the via and the second via.

13. The method of claim 11, further comprising forming the second dielectric material selected from a group consisting of: SiCN, SiON, and black diamond.

14. The method of claim 11, further comprising forming the cap layer of an electrically conductive material comprising titanium nitride.

15. The method of claim 11, further comprising exposing a first portion of the liner layer to the second via and a second portion of the liner layer to the third via.

16. The method of claim 11, wherein the metal layer comprises copper metal and wherein the dielectric material is selected to mitigate diffusion of the copper metal through the dielectric material.

17. The method of claim 11, wherein the dielectric material is a high-K dielectric material having a relative permittivity greater than about 7.0.

18. The method of claim 11, further comprising forming the switching layer at least in part from the dielectric material having the high-K dielectric material.

19. The method of claim 11, further comprising etching with a second etch process the first portion of the liner layer and the second portion of the liner layer and exposing a top surface of the cap layer through the via.

20. The method of claim 19, further comprising forming a second metal layer within the via and in electrical contact and in physical contact with the top surface of the cap layer.

* * * * *